United States Patent
Kovesi et al.

(10) Patent No.: US 10,403,296 B2
(45) Date of Patent: Sep. 3, 2019

(54) RESAMPLING AN AUDIO SIGNAL FOR LOW-DELAY ENCODING/DECODING

(71) Applicant: KONINKLIJKE PHILIPS N.V., Eindhoven (NL)

(72) Inventors: Balazs Kovesi, Lannion (FR); Stephane Ragot, Lannion (FR)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 659 days.

(21) Appl. No.: 15/025,138

(22) PCT Filed: Sep. 26, 2014

(86) PCT No.: PCT/FR2014/052430
§ 371 (c)(1),
(2) Date: Mar. 25, 2016

(87) PCT Pub. No.: WO2015/044609
PCT Pub. Date: Apr. 2, 2015

(65) Prior Publication Data
US 2016/0232907 A1    Aug. 11, 2016

(30) Foreign Application Priority Data
Sep. 30, 2013 (FR) .................................. 13 59456

(51) Int. Cl.
*G10L 19/00* (2013.01)
*G10L 19/04* (2013.01)
(Continued)

(52) U.S. Cl.
CPC ............ *G10L 19/04* (2013.01); *G10L 19/005* (2013.01); *G10L 19/18* (2013.01); *G10L 19/24* (2013.01); *H03H 17/0621* (2013.01)

(58) Field of Classification Search
None
See application file for complete search history.

(56) References Cited

U.S. PATENT DOCUMENTS 8,214,202 B2 * 7/2012 Bruhn ..................... G10L 19/24
704/200.1
9,940,943 B2 * 4/2018 Ragot ................ H03H 17/0621
(Continued)

FOREIGN PATENT DOCUMENTS

EP    1316087 B1    1/2008
WO    2012103686 A1    8/2012

OTHER PUBLICATIONS

International Search Report dated Jan. 12, 2015 for corresponding International Application No. PCT/FR2014/052430, filed Sep. 26, 2014.
(Continued)

*Primary Examiner* — Satwant K Singh

(57) ABSTRACT

A method and device for resampling an audio frequency signal in an audio frequency signal coding or decoding. The method includes the following acts for each signal block to be resampled: determining, by adaptive linear prediction, a number of future signal samples, this number being defined as a function of a chosen resampling delay; constructing a resampling support vector from at least samples of the current block and determined future signal samples; applying a resampling filter to the samples of the resampling support vector.

11 Claims, 10 Drawing Sheets

(51) Int. Cl.
*G10L 19/005* (2013.01)
*G10L 19/18* (2013.01)
*H03H 17/06* (2006.01)
*G10L 19/24* (2013.01)

(56) References Cited

U.S. PATENT DOCUMENTS

| | | | |
|---|---|---|---|
| 10,147,430 B2* | 12/2018 | Neukam | G10L 19/008 |
| 10,236,006 B1* | 3/2019 | Gurijala | G10L 19/018 |
| 2010/0070271 A1 | 3/2010 | Kovesi et al. | |
| 2013/0096913 A1* | 4/2013 | Bruhn | G10L 19/06 |
| | | | 704/219 |
| 2017/0133027 A1* | 5/2017 | Kovesi | G06F 17/17 |
| 2017/0154631 A1* | 6/2017 | Disch | G10L 19/008 |
| 2017/0372714 A1* | 12/2017 | Kovesi | G10L 19/04 |
| 2018/0102134 A1* | 4/2018 | Disch | G10L 19/008 |
| 2018/0144760 A1* | 5/2018 | Niedermeier | G10L 19/008 |

OTHER PUBLICATIONS

Schafer et al., "A Digital Signal Processing Approach to Interpolation", Proceedings of the IEEE, vol. 61, No. 6, Jun. 1973, pp. 692-702.
Regalia et al., "The Digital All-Pass Filter: A Versatile Signal Processing Building Block", Proceedings of the IEEE, vol. 76, No. 1, Jan. 1988.

* cited by examiner

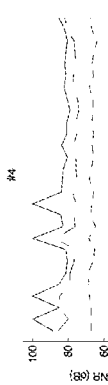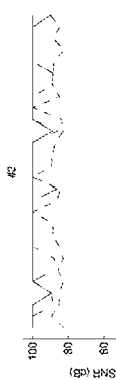

RESAMPLING AN AUDIO SIGNAL FOR LOW-DELAY ENCODING/DECODING

CROSS-REFERENCE TO RELATED APPLICATIONS

This Application is a Section 371 National Stage Application of International Application No. PCT/FR2014/052430, filed Sep. 26, 2014, the content of which is incorporated herein by reference in its entirety, and published as WO 2015/044609 on Apr. 2, 2015, not in English.

FIELD OF THE DISCLOSURE

The present invention relates to the processing of an audio frequency signal for the transmission or storage thereof. More particularly, the invention relates to a change of sampling frequency upon a coding or a decoding of the audio frequency signal.

BACKGROUND OF THE DISCLOSURE

There are many techniques for compressing (with loss) an audio frequency signal such as speech or music. The coding can be performed directly at the sampling frequency of the input signal, as for example in the ITU-T recommendations G.711 or G.729 in which the input signal is sampled at 8 kHz and the coder and decoder operate at this same frequency.

However, some coding methods use a change of sampling frequency, for example to reduce the complexity of the coding, adapt the coding according to the different frequency subbands to be coded, or convert the input signal for it to correspond to a predefined internal sampling frequency of the coder.

In the subband coding defined in the ITU-T recommendation G.722, the input signal at 16 kHz is divided into 2 subbands (sampled at 8 kHz) which are coded separately by a coder of ADPCM (Adaptive Differential Pulse Code Modulation) type. This division into two subbands is carried out by a bank of quadratic mode mirror filters with Finite Impulse Response (FIR), of order 23, which theoretically results in an analysis-synthesis delay (coder+decoder) of 23 samples at 16 ms; this filter bank is implemented with a polyphase realization. The division into two subbands in G.722 makes it possible to allocate, in a predetermined manner, different bit rates to the two subbands as a function of their a priori perceptual importance and also to reduce the overall coding complexity by executing two coders of ADPCM type at a lower frequency. However, it induces an algorithmic delay compared to a direct ADPCM coding.

Various methods for changing the sampling frequency, also called resampling, of a digital signal are known, by using, for example and in a nonexhaustive manner, an FIR (Finite Impulse Response) filter, an IIR (Infinite Impulse Response) filter or a polynominal interpolation (including the splines). A review of the conventional resampling methods can be found for example in the article by R. W. Schafer, L. R. Rabiner, A Digital Signal Processing Approach to Interpolation, Proceedings of the IEEE, vol. 61, no. 6, June 1973, pp. 692-702.

The advantage of the FIR filter (symmetrical) lies in its simplified implementation and—subject to certain conditions—in the possibility of ensuring a linear phase. A linear phase filtering makes it possible to preserve the waveform of the input signal, but it can also be accompanied by a temporal spreading (or ringing) that can create artifacts of pre-echo type on transients. This method results in a delay (which is dependent on the length of the impulse response), generally of the order of 1 to a few ms to ensure appropriate filtering characteristics (ripple in the bandwidth, rejection level sufficient to eliminate the aliasing or spectral images . . . ).

The alternative of resampling by IIR filter generally leads to a non-linear phase, unless the phase is compensated by an additional all-pass filtering stage as described for example in the article by P. A. Regalia, S. K. Mitra, P. P. Vaidyanathan, The Digital All-Pass Filter: A Versatile Signal Processing Building Block, Proceedings of the IEEE, vol. 76, no. 1, January 1988, with an exemplary realization in the "iirgrpdelay" routine of the MATLAB software; an IIR filter is generally of a lower order but more complex to implement in fixed-point notation, the states (or memories) of the filter being able to reach high dynamic values for the recursive part, and this problem is amplified if a phase compensation by all-pass filtering is used.

FIG. 1 illustrates an example of down-sampling by a ratio of 4/5 with an FIR filter with a length of 2*60+1=121 coefficients at 64 kHz to change from 16 kHz to 12.8 kHz. The x-axes represent the time (grounded to ms to represent the signals clocked at different frequencies) and the y-axes the amplitudes. The squares at the top represent the temporal positions of the samples of the input signal at 16 kHz; it is assumed here that these samples correspond to the end of a 20 ms frame. The continuous vertical lines mark the corresponding sampling instants at 16 kHz. At the bottom of the figure, the dotted vertical lines mark the corresponding sampling instants at 12.8 kHz and the stars symbolize the output samples at 12.8 kHz. Also represented is the impulse response (symmetrical) of 121 coefficients of an FIR filter at 64 kHz, this response is positioned to calculate the last sample of the current frame at 12.8 kHz (the position of the impulse response maximum is aligned with this sample). The circles show the values used (corresponding to the input sampling moment) in a polyphase representation; to obtain the output sample, these values are multiplied by the corresponding input sample and these results are added together. It will be noted in this figure that 12 samples (up to the end of the input frame) at 12.8 kHz cannot be calculated exactly because the input samples after the end of the current frame (start of the next frame) are not yet known; the down-sampling delay in the conditions of FIG. 1 is 12 samples, i.e. 12/12.8=0.9375 ms.

There are techniques for reducing the delay introduced by the changes of sampling frequency of FIR type.

In the 3GPP AMR-WB standard (also defined as the ITU-T recommendation G.722.2), the input signal sampled at 16 kHz is down-sampled at an internal frequency of 12.8 kHz before applying a coding of CELP type; the signal decoded at 12.8 kHz is then resampled at 16 kHz and combined with a high-band signal.

The advantage of passing through an intermediate frequency of 12.8 kHz is that it makes it possible to reduce the complexity of the CELP coding and also to have a frame length that is a multiple of a power of 2, which facilitates the coding of certain CELP parameters. The method used is a conventional resampling by a factor 4/5 by FIR filter (of 121 coefficients at 64 kHz), with a polyphase realization to minimize the complexity.

In theory, this resampling on the coder and on the AMR-WB decoder should result in a delay in a manner similar to the processing represented in FIG. 1. In the case of the AMR-WB codec, with an FIR filter of 121 coefficients, the total delay should in theory be 2×60 samples at 64 kHz, i.e. 2×15 samples at 16 kHz or 1.875 ms; in fact, a specific technique is implemented on the AMR-WB coder to eliminate (compensate) the associated delay in the coder part only and therefore divide the effective delay by 2.

This compensation method is described in the 3GPP standard TS 26.190, Clause 5.1 and in the ITU-T recommendation G.722.2, Clause 5.1. The method for compensating the FIR filtering delay consists in adding, for each new frame sampled at 16 kHz to be converted to 12.8 kHz, a predetermined number of zeros at the end of the current frame. These zeros are defined at the input sampling frequency and their number corresponds to the delay of the resampling FIR filter at this frequency (i.e. 15 zeros added at 16 kHz). The resampling is implemented per 20 ms frame (320 samples). The resampling in the AMR-WB coder is therefore equivalent to complementing the input frame of 320 samples on the left (toward the past) with 30 samples from the end of preceding frame (resampling memory) and on the right with 15 zeros to form a vector of 30+320+15=365 samples, which is then resampled with a factor 4/5. The FIR filter can thus be implemented with a zero phase, therefore without delay, since a null future signal is added. In theory, the FIR resampling by a factor 4/5 is performed according to the following steps:

up-sampling by 4 (from 16 kHz to 64 kHz) by addition of 3 samples at 0 after each input sample low-pass filtering of transfer function $H_{decim}(z)$ of symmetrical FIR type of order 120 at 64 kHz down-sampling by 5 (from 64 kHz to 12.8 kHz) by keeping only one sample out of five from the low-pass filtered signal.

In practice, this resampling is implemented in an equivalent manner according to an optimized polyphase realization without calculating the intermediate signal at 64 kHz and without concatenating the signal to be converted with zeros (see the "decim54.c" file of the source code of the AMR-WB codec); the FIR filtering for each "phase" is equivalent to an FIR filter of order 24 at 12.8 kHz with a delay of 12 samples at 12.8 kHz, i.e. 0.9375 ms.

The result of the FIR resampling of each 20 ms frame from 16 kHz to 12.8 kHz is identical to a resampling formed on the "complete" input signal (i.e. not cut up into frames), except for the last 12 samples of each resulting frame at 12.8 kHz which include an error due to the use of a block of zeros as future signal instead of the "true" future signal which is available only on the next frame. In fact, the zeros introduced simulate the case of a null input signal in the next frame.

This processing is illustrated at the end of a 20 ms frame in FIG. 2 which represents the last input samples at 16 kHz by the squares at the top; the vertical lines mark the corresponding sampling moments at 16 kHz. At the bottom of the figure, the stars symbolize the output samples at 12.8 kHz which can be obtained by conventional down-sampling with a delay of 12 samples. Then, the triangles at the bottom correspond to the 12 samples at 12.8 kHz obtained by using at least one sample of null value added at the end of the frame to be able to continue the filtering and reduce the delay. These samples are numbered from #1 to #12 according to their position relative to the end of the output obtained with a conventional filtering. Also represented is the impulse response of the filter at 64 kHz used in the position corresponding to the last output sample at 12.8 kHz (the impulse response maximum is aligned with this sample). The circles show the values used (corresponding to the input sampling moment) in the polyphase representation; to obtain the output sample, these values are multiplied by the corresponding input sample or by 0 for the values after the end of the frame and these results are added together. It can be seen here that, for this last sample, almost half of the samples used from the impulse response are multiplied by the added zeros, which therefore introduces a significant estimation error. It will also be understood that the error of the first samples generated after the conventional filtering (that is to say with only the true input signal) is small (the weight of the impulse response at its end is low) and the error becomes greater with increasing distance from the conventional filtering (the weight of the impulse response then being greater). That will be able to be observed in the results of FIG. 7.

The delay compensation method used in the AMR-WB codec, where zeros are added at the end of each 20 ms block (or frame) to be resampled, makes it possible to eliminate the resampling delay on the coder, but it is not satisfactory generally when the values generated at the end of the current frame (with zeros added at the input) are coded directly and are not replaced by the true values once the input signal of the next frame is known. In fact, these regular errors at the end of each frame generate periodic discontinuities in the transition to the true output signal at the start of the next frame. These discontinuities are often audible and a great nuisance. This is why the delay compensation is applied only on the coder and only in the future signal part, called lookahead, and not on the AMR-WB decoder.

In fact, in the AMR-WB coder, each new 20 ms input frame at 16 kHz corresponds to a time segment corresponding to the last 15 ms of the current frame to be coded by ACELP model and 5 ms of future signal (or lookahead). The first 5 ms of the current frame to be coded have already been received and stored as "lookahead" of the preceding segment. The last 12 samples obtained after resampling from 16 to 12.8 kHz on the coder therefore correspond to the last samples of the 5 ms future signal at 12.8 kHz. Consequently, the current 20 ms frame at 12.8 kHz (i.e. 256 samples) and the 5 ms of future signal (i.e. 64 samples) is complemented with 5 ms of past original signal (loopback) to form the LPC analysis buffer of 384 samples (30 ms) which is weighted by an LPC analysis window of the same length.

The last 12 samples of the "lookahead" at 12.8 kHz comprising a resampling error have a very low relative weight in the window used for the linear prediction (LPC), and a fortiori they have impact only on the estimated LPC envelope and this impact is very negligible. It is important to note that the 12 erroneous samples are replaced by the "exact" resampling values on the next frame, the error is therefore present only temporarily in the current frame for the future signal (lookahead) and affects only the LPC analysis. Thus, the delay compensation technique of the AMR-WB coder does not affect the coding of the waveform of the signal in the current frame in the AMR-WB codec. This mode will hereinafter be referred to as: "use by frame with future signal". The samples that are thus generated are only used temporarily for intermediate calculations (LPC analysis) and are replaced by the samples correctly resampled when the signal of the next frame is known. It will be noted that, in this configuration, for an output frame of length lg_out for each frame, lg_out+12 samples are generated by the resampling.

This delay compensation technique used on the AMR-WB coder is not applied to the AMR-WB decoder.

Thus, the codec (coder+decoder) has a total algorithmic delay of 25.9375 ms due to the coder (20 ms frame+5 ms lookahead) and to the resampling on the decoder (0.9375 ms).

The delay compensation technique of the AMR-WB coder could not be used to reduce the QMF filtering delay of the G.722 codec, because it would greatly degrade the quality of the coding signal. In effect, in the G.722 codec, the samples resulting from the filtering (the low-band and high-band signals) directly constitute the input signals of the two ADPCM sub-codecs which operate without "lookahead" and which do not make it possible to correct these values from one frame to another. This mode will hereinafter be referred to as: "continuous frame-by-frame use".

SUMMARY

An exemplary embodiment of the present application relates to a method for resampling an audio frequency signal in an audio frequency signal coding or decoding. The method is such that it comprises the following steps for each signal block to be resampled:
  determinating, by adaptive linear prediction, a number of future signal samples, this number being defined as a function of a chosen resampling delay;
  constructing a resampling support vector from at least samples of the current block and determined future signal samples;
  applying a resampling filter to the samples of the resampling support vector.

Thus, the resampling according to the invention makes it possible to reduce the resampling delay by filter (per block or per frame), while keeping a performance level very close to a continuous resampling. The prediction of the future signal in each block or frame makes it possible to have samples closer to the real samples than if these future samples were set at a null value. The performance of the resampling process for these latter samples is therefore better.

This resampling method is also adaptive since it is possible to adapt the number of future signal samples to be taken into account as a function of the desired delay. For a resampling without delay, the number of future signal samples to be determined then corresponds to the delay of the resampling filter. If a delay lower than the delay of the filter is tolerated, then the number of future signal samples can correspond to just a part of the delay of the resampling filter.

With the adaptation of the resampling delay being performed per signal block, it is then possible to easily switch, from one block to another or from one frame to another, between different resampling configurations (including the FIR filter used for this purpose) or to switch from a direct coding of a given frame at a certain sampling frequency to a coding of the next frame with resampling, or vice versa.

The various particular embodiments mentioned hereinbelow can be added independently or in combination with one another, to the steps of the resampling method defined above.

In a simple embodiment, the step of determination by adaptive linear prediction comprises the following steps:
  obtaining coefficients of a linear prediction filter of predetermined order;
  obtaining future signal samples by application of the prediction filter obtained to an excitation signal of null value.

In a particular embodiment, the coefficients of the linear prediction filter are obtained by reading parameters stored in the coding or decoding step.

Thus, when the coding module, independently of the resampling device, comprises an LPC analysis which already determines the parameters of the prediction filter, there is no need to recalculate these parameters in the resampling method. It is sufficient to merely read the parameters which have been stored (quantified or not).

In another embodiment, the coefficients of the linear prediction filter are obtained by analysis from at least samples of the current block.

The LPC analysis is then done directly in the resampling device.

In an exemplary embodiment, the linear prediction is performed on an audio frequency signal on which a pre-emphasis processing has been performed.

The pre-emphasis makes it possible to ensure a better digital stability in a fixed-point notation implementation, in particular for the signals having a strong slope and spectral dynamic. It reduces the spectral dynamic of the signal, the distribution of the power of the signal over the frequency bands thus becomes more uniform after the pre-emphasis. The post-pre-emphasis modeling parameters have a lower dynamic, and it is easier to ensure the stability of the system and also easier to implement the algorithm using this model with a fixed-point notation arithmetic.

In possible embodiments, the adaptive linear prediction is a prediction from one of the following methods:
  short-term linear prediction;
  long-term linear prediction;
  combination of short-term linear prediction and long-term linear prediction;
  erased frame concealment process.

Thus, any more or less accurate prediction type is possible for the implementation of the method while ensuring an effectiveness in terms of advantageous signal-to-noise ratio.

The present invention also targets a device for resampling an audio frequency signal in an audio frequency signal coder or decoder. The device is such that it comprises:
  an adaptive linear prediction module suitable for determining, for each signal block, a number of future signal samples defined as a function of a chosen resampling delay;
  a module for constructing a resampling support vector from at least samples of the current block and determined future signal samples;
  a resampling filter applied to the samples of the resampling support vector.

This device offers the same advantages as the method described previously, that it implements.

In a particular embodiment, the adaptive linear prediction module cooperates with a prediction analysis module included in the prediction coding or decoding module of the coder or decoder.

Thus, the complexity of the resampling device is reduced since there is no need to include any LPC analysis module. The parameters obtained from the analysis module of the coding or decoding module are stored in the coding or the decoding and can thus be used in the resampling.

The present invention also targets an audio frequency signal coder and decoder comprising at least one resampling device as described.

In a particular embodiment, the coder or the decoder comprises a resampling device using at least two resampling filters having different delays, at least one of the filters being implemented according to the method as described previously for which the determination of the number of future signal samples is a function of the delay difference of the two resampling filters used.

Since the resampling filters are often associated with different coding modes, this embodiment makes it possible to switch easily from one coding mode to another without there being any audible artifacts.

The invention targets a computer program comprising code instructions for implementing the steps of the resampling method as described, when these instructions are executed by a processor.

Finally, the invention relates to a processor-readable storage medium, incorporated or not in the resampling device, possibly removable, storing a computer program implementing a resampling method as described previously.

BRIEF DESCRIPTION OF THE DRAWINGS

Other features and advantages of the invention will become more clearly apparent from reading the following description, given purely as a nonlimiting example, and with reference to the attached drawings, in which:

FIGS. 7a to 7l show, for different sample positions following the current signal frame to be resampled, a comparison of the signal-to-noise ratio as a function of the center frequency obtained by the application to a test signal of the resampling method of the prior art implemented in the AMR-WB coder and of the resampling method according to a first and a second embodiment of the invention;

DETAILED DESCRIPTION OF ILLUSTRATIVE EMBODIMENTS

Figure 3:
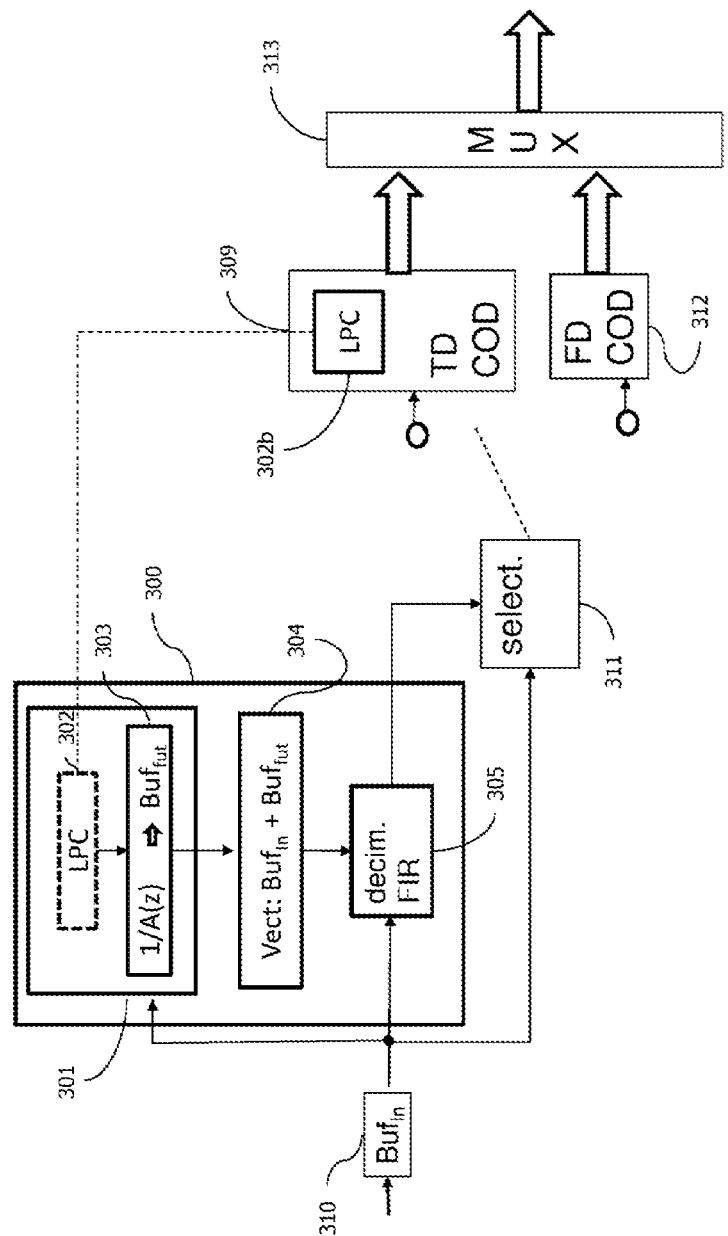
FIG. 3 illustrates an exemplary audio signal coder comprising a resampling device according to an embodiment of the invention.

FIG. 3 illustrates an example of an audio coder comprising a resampling device 300 according to an embodiment of the invention.

The codec illustrated here is a coder of audio signals (mono), multi-bit rate (with bit rates set from 7.2 to 128 kbit/s) operating at the input and output sampling frequencies of 8, 16, 32 or 48 kHz. Interest is focused first of all on the coder part represented in FIG. 3, the associated decoder being described later in conjunction with FIG. 9.

The input signal is divided into 20 ms frames (block 310), each frame can be coded either according to a time domain (TD) approach of CELP type (309) or according to a frequency domain (FD) approach of MDCT type (block 312) before being multiplexed by the multiplexing module 313. It is considered here that the codings of CELP and MDCT type are known to those skilled in the art. The choice of the mode (block 311)—which includes that of the internal coding frequency—is not detailed here.

In this codec, which is flexible in terms of bit rates and of sampling frequencies, a number of resampling configurations of a frequency "$f_{In}$" (In for input) at a frequency "$f_{Out}$" (Out for output) are necessary. In an embodiment described here, the configurations used are listed in table 1 below:

TABLE 1

| Config. number | Conversion configuration ($f_{In}$ -> $f_{Out}$) | FIR filter used | filt_ len$_{in}$ | fac_ num | fac_ den |
|---|---|---|---|---|---|
| 1 | 8000 Hz -> 12 800 Hz | f_5_8_129 | 16 | 8 | 5 |
| 2 | 12 800 Hz -> 8000 Hz | f_5_8_129 | 24 | 5 | 8 |
| 3 | 16 000 Hz -> 8000 Hz | f_12_180 | 30 | 6 | 12 |
| 4 | 12 800 Hz -> 16 000 Hz | f_15_180 | 12 | 15 | 12 |
| 5 | 12 800 Hz -> 32 000 Hz | f_15_180 | 12 | 15 | 6 |
| 6 | 12 800 Hz -> 48 000 Hz | f_15_180 | 12 | 15 | 4 |
| 7 | 16 000 Hz -> 12 800 Hz | f_15_180 | 15 | 12 | 15 |
| 8 | 16 000 Hz -> 32 000 Hz | f_12_180 | 15 | 12 | 6 |
| 9 | 16 000 Hz -> 48 000 Hz | f_12_180 | 15 | 12 | 4 |
| 10 | 32 000 Hz -> 12 800 Hz | f_15_180 | 30 | 6 | 15 |
| 11 | 32 000 Hz -> 16 000 Hz | f_12_180 | 30 | 6 | 12 |
| 12 | 48 000 Hz -> 12 800 Hz | f_15_180 | 45 | 4 | 15 |
| 13 | 48 000 Hz -> 16 000 Hz | f_12_180 | 45 | 4 | 12 |

In this table, the frequency values in bold indicate "external" frequencies (that is to say input and/or output frequencies) of the codec, and the other frequency values are "internal" sampling frequencies for the coding of the low band of the signal—in a manner similar to the AMR-WB coding which has only one external frequency at 16 kHz and one internal frequency at 12.8 kHz. "filt_len$_{in}$" represents the length of the filter, "fac_num" represents the up-sampling factor and "fac_den" the down-sampling factor.

With no loss of generality, the FIR filters are designed in the example illustrated here according to the conventional method, called "window method", because it involves a windowing of a cardinal sine (sin(x)/x). The FIR filters are for example designed as explained below.

For example, the filter f_5_8_129 is obtained with the following matlab command:
f_5_8_129=[0 0 0 0 fir1(248,(3775/32000),hanning(249)) *4.999895 0 0 0 0];
with a cutoff frequency (−6 dB) at 64 kHz of 3775 Hz.

These coefficients are used as a filter of 16 coefficients at 8000 Hz (i.e. 128 coefficient at 64 000 Hz) and as a filter of 24 coefficient at 12 800 Hz (i.e. 120 coefficients at 64 000 Hz, disregarding the last values)

The filter f_12_180 is obtained with the following matlab commands:
ftmp=fir1(358,1/12,hanning(359));
f_12_180=[0 ftmp/ftmp(180) 0];
with a cutoff frequency (−6 dB) at 192 kHz of 8000 Hz.

The filter f_15_180 is obtained with the following matlab commands:
ftmp=fir1(358,1/15,hanning(359));
f_12_180=[0 ftmp/ftmp(180) 0];

with a cutoff frequency (−6 dB) at 192 kHz of 6400 Hz. In variants of the invention, of course, other FIR filter design methods can be used.

These conversion configurations are justified here, with no loss of generality, by the use of 2 internal frequencies, 12.8 kHz and 16 kHz, in the coding algorithm. Neither the way in which the choice of the internal sampling frequency (12.8 or 16 kHz) is made, nor the way in which the choice of the type of coding to be employed (block 311) is made is detailed here. That exceeds the scope of the invention. However, it will be remembered that the choice of the internal frequency can be made independently in each frame, for a same input and/or output frequency of the codec, which, for example, means that it is possible, at the frame N to use a resampling according to a configuration i, at the frame N+1, a resampling according to the configuration j different from i (but with a same "external" frequency), and at the frame N+2, no resampling, which means a direct coding of the frame at the input frequency $f_{In}$—in practice, this last case is possible in the preferred embodiment only in the following situations:

if the coding mode chosen is the coding of FD type, which always operates at the frequency $f_{In}$ if the coding mode chosen is the TD coding and the input frequency $f_{In}$ corresponds to the internal TD coding frequency.

However, in a variant of the invention, the coding of FD type will be able to be forced to operate at the same internal coding frequency as the TD coding, in order to facilitate the switching thereof.

Note that the transition from a TD coding to an FD coding and vice versa is not described here because it goes beyond the scope of the invention.

When the sampling frequency of the input signal $f_{In}$ is greater than the internal coding sampling frequency the coding algorithm TD COD or FC COD provides the coding of the signal in high band (frequencies greater than 6.4 or 7 kHz), this coding of the high band is not detailed here.

Thus, the coder comprises a resampling device 300 which includes a parameterizable resampling filter because it can operate with a number of FIR filter coefficient configurations (block 305). In the embodiments described hereinbelow, the resampling filter is a polyphase filter. The invention applies also to other types of implementation of resampling by FIR filter such as, for example, a resampling filter of non-optimal complexity which does not involve the polyphase representation. Moreover, the invention applies also for other sampling frequency conversion ratios.

With the exception of the first three configurations (numbers 1 to 3), all the other configurations use a polyphase filter of FIR type with a delay of 0.9375 ms (12 samples at 12.8 kHz, 15 samples at 16 kHz, 30 samples at 32 kHz and 45 samples at 48 kHz).

The polyphase resampling filtering (block 305) in configurations 4 to 13 is performed according to an algorithm derived from the polyphase resampling by FIR defined in the ITU-T G.718 codec (see the realization in the source code of G.718 in the "modify_fs.c" file).

The interest here is focused on the first 3 configurations involving an "external" sampling frequency of 8000 Hz. For these configurations, a longer FIR filter is necessary to have adequate filtering performance, in particular to guarantee a sufficient rejection of spectral images or of the spectral aliasing which can occur in the frequencies where the ear is very sensitive.

Without the implementation of the resampling method of the invention, these 3 configurations would result normally in 25 samples of delay at 12.8 kHz for the case of the resampling from 8000 Hz to 12 800 Hz, 15 samples of delay at 8 kHz for the cases of the resampling from 12 800 Hz to 8000 Hz and of the resampling from 16 000 Hz to 8000 Hz. Generally, the delay at the output sampling frequency is rounded to the integer below filt_len*fac_num/fac_den, where filt_len is the length of the filter, fac_num is the up-sampling factor and fac_den is the down-sampling factor (see also in table 1), but it would also be possible to consider a delay with a fraction of half a sample.

The implementation, in the resampling device 300, of the resampling method according to the invention and described below with reference to FIGS. 4a and 4b, makes it possible, in the case of this coder:

to limit the effective delay of configurations 1 to 3 to obtain a delay identical to the other conversion configurations 4 to 13 (which have a delay of 0.9375 ms). To do this, the resampling device comprises an adaptive linear prediction module 301, suitable for determining, for each signal frame, a number of future signal samples defined as a function of a chosen resampling delay. It will be noted that the number of samples is theoretically parameterizable but in practice, it is kept constant for the defined codec configuration.

To be able to switch all the defined resampling configurations, even if the associated theoretical delay is different.

In a particular embodiment of the invention which is not described in table 1, the coder can comprise a number (at least two) of polyphase FIR resampling filters resulting in different delays. For example, in a multiple bit rate coder, for an input which is always at 16 000 Hz, it is possible to use 2 different internal frequency coding cores according to the bit rate: 8000 Hz for the lower bit rates and 12 800 Hz for the higher bit rates. To have a sufficient filtering performance level, in particular to guarantee a sufficient rejection of spectral images or of the spectral aliasing, the resampling from 16 000 Hz to 8000 Hz requires a longer FIR filter than the resampling from 16 000 Hz to 12 800 Hz. These two filterings therefore have a different delay. To be able to switch between these two coding modes without artifact (in case of change of bit rate), these delays must be harmonized (made equal). If the length of the resampling FIR filter is reduced from 16 000 Hz to 8000 Hz, the quality is generally degraded because the spectral aliasing would not be sufficiently well attenuated and would become audible. If the length of the resampling FIR filter is increased from 16 000 Hz to 12 800 Hz, or an additional delay is applied to the resampled signal, the overall delay of the coding/decoding is increased, which can hamper the interactivity.

By using the resampling method of the present invention, it is possible to reduce the delay of the longer FIR filterings to the level of the shorter filtering delay, without notable loss of quality, compared with the original filtering. In fact, the simulation results show that the signal-to-noise ratios are very high between the normal filtering and the low-delay filtering according to the present invention. It is also demonstrated by the listening tests that the difference between the signals obtained with the normal filtering and the low-delay filtering according to the present invention is not audible.

Thus, in the case presented here, the coder (or even the decoder) comprises two polyphase resampling filters with different delays. At least one of the resampling filters is a filter implemented as described previously according to the invention in which the determination of the number of future signal samples is a function of the delay difference of the two resampling filters used in the two devices.

For example, in table 1, the configurations 3 to 7 can be used for an external frequency of 16 000 Hz and internal frequencies of 8000 Hz and 12 800 Hz. In this case, it can be seen that the delay at the input frequency (filt_len) is respectively 30 and 15 samples; it is therefore necessary to predict the difference, i.e. 15 samples at 16 000 Hz, to be able to reduce the delay of the configuration 3 to the level of the delay of the configuration 7. The invention detailed later will be able to be used to reduce the delay of the configuration 3 and to be able to alternate between the configurations 3 and 7 transparently, because they then have the same delay of 15 samples.

To revert to the example of the coder of FIG. 3 and of the configurations listed in table 1:

in the case of the resampling from 8000 Hz to 12 800 Hz, it is necessary to reduce the delay from 25 to 12 samples, i.e. generate plus_sample_out=13 additional samples at 12 800 Hz, which necessitates the extrapolation of plus_sample_in=8 samples at 8000 Hz.

For the case of the resampling from 12 800 Hz to 8000 Hz, it is necessary to reduce the delay from 15 to 7 samples, i.e. generate plus_sample_out=8 additional samples at 8000 Hz, which necessitates the extrapolation of plus_sample_in=12 samples at 12 800 Hz.

For the case of the resampling from 16 000 Hz to 8000 Hz, it is necessary to reduce the delay from 15 to 7 samples, i.e. generate plus_sample_out=8 additional samples at 8000 Hz, which necessitates the extrapolation of plus_sample_in=15 samples at 16 000 Hz. It should be noted that, at 8000 Hz, 0.9375 ms corresponds to 7.5 samples that have been rounded down to 7 samples.

The resampling device 300 illustrated in FIG. 3, receives audio signal blocks as input, and in this embodiment they are 20 ms frames received by the block 310 which also has in memory a set of samples from past frames.

This resampling device comprises an adaptive linear prediction module 301 suitable for determining, for each signal block or frame, a number of future signal samples defined as a function of a chosen resampling delay.

This predicted number of future signal samples is used to determine the resampling support defined by the module 304 for constructing the resampling support vector. This resampling support vector is, for example, a concatenation of possible past signal samples, samples from the current block or frame and future signal samples predicted by the module 301. The past signal samples serve as memory for the resampling FIR filter.

Nevertheless, the construction of this support vector also comprises the following implementation:

the past signal can be stored in the memories of the resampling FIR filter and is not therefore directly concatenated with the samples of the current frame (but the signal of the current frame is indeed the continuity of these memories containing the past signal)

the predicted future signal can also be stored in a separate vector and its resampling can be done separately from that of the signal of the current frame, as long as the necessary memories are updated correctly. In the case of the separate resampling of the future signal, the memories of the resampling filter are initialized by the latest samples of the current frame. Once again, despite this separation, the predicted future signal is indeed the continuation of the signal of the current frame.

In this document, with no loss of generality, the term "construction of the support vector" also covers the cases where the signals are not really copied one after the other in a same vector but stored in different vectors.

The filter 305 is then applied to this resampling support vector to obtain a signal resampled at the desired output frequency.

The linear prediction module 301 can comprise a short-term prediction analysis module 302 (LPC) suitable for determining the coefficients of a linear prediction filter as described later in relation to FIG. 4a. This LPC analysis module (302b) can, in another advantageous embodiment, be included in the prediction coding module 309 of the temporal coding of TD type (for example a CELP coding). Thus, the same analysis module can be used both to predict useful future samples for the resampling device and to code the signal before transmission. This therefore reduces the complexity of the resampling device which cooperates with the analysis module of the coding module.

The module 301 further comprises a prediction filtering module 303 by the 1/A(z) filtering of a null signal to obtain a set of future samples $\text{buf}_{fut}$.

Figure 4B:
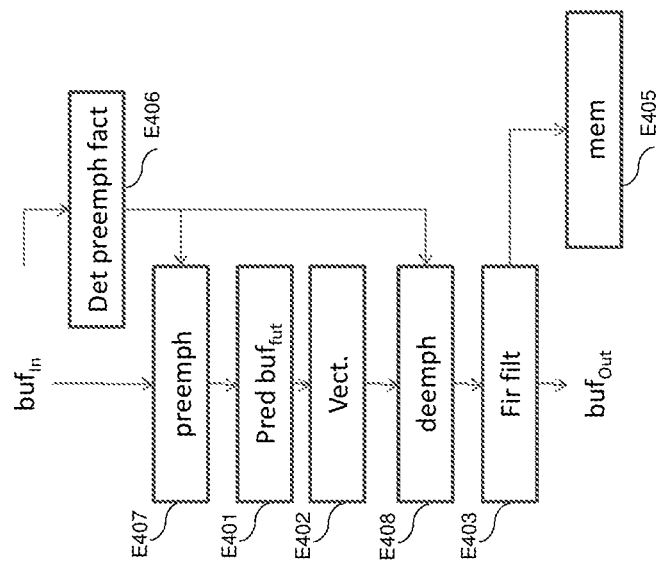
FIG. 4b illustrates, in flow diagram form, the steps of a variant embodiment of a resampling method according to the invention.
Figure 4A:
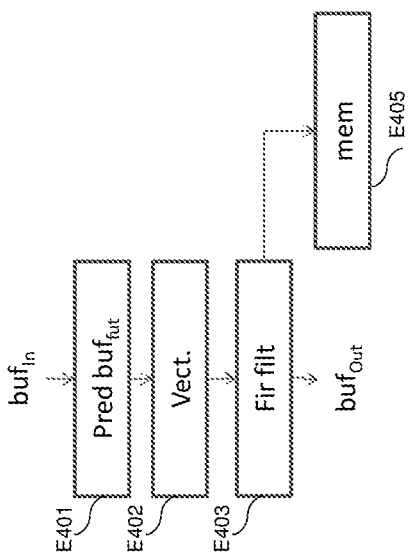
FIG. 4a illustrates, in flow diagram form, the steps of a resampling method according to an embodiment of the invention.

FIG. 4a therefore illustrates the main steps of a resampling method according to an embodiment of the invention.

The steps of this method are implemented with, as input ($\text{Buf}_{In}$), frames of lg samples at the input sampling frequency $f_{In}$. There is also access to the past samples of this input signal through the memories. From this input signal, the step E401 determines the number of samples to be predicted plus_sample_in, as a function of the desired delay and predicts this number of future signal samples by linear prediction. The result of this prediction is concatenated on the input signal (current frame and past frames for the memories) in the step E402 of construction of the resampling support vector. This support vector is therefore, in one embodiment, a concatenation of samples of the past signal, samples of the current frame and determined future signal samples.

In the step E403, the resampling filtering is performed by application of a resampling filter, for example with finite impulse response (FIR), to the samples of the resampling support vector, and the resampled signal $\text{buf}_{out}$ is supplied as output, at the output resampling frequency $f_{out}$.

A number of cases are then possible:

in the case of a continuous frame-by-frame use (lg samples as input), only the last lg_out=lg*fac_num/fac_den samples are calculated.

In the case where more samples have to be obtained (use per frame with future signal) (lg+plus_sample_in samples as input), as is the case in the coder of the AMR-WB standard, lg_out+plus_sample_out samples are calculated, where plus_sample_out=plus_sample_in*fac_num/fac_den.

In fact, in the AMR-WB coder, the current 20 ms frame is resampled and 15 additional samples are resampled; the first step replaces the error from resampling performed in the second step. In this example, lg=320, plus_sample_in=15.

The use can also be one-off, when, for example, a memory (a piece or block of the signal) is resampled, for example in the case of a switch between two coding modes. In this case, the resampling input is not a frame (for example of 20 ms) but a signal block. In order to apply the invention, it is important to note that it is essential to have either the past of the block to be converted or else an LPC model already pre-calculated from the past—it will be noted that, with a coding of TD type already using a linear prediction, it is generally possible to store the parameters (LPC or equivalent coefficients) calculated and/or coded in the TD coder and/or decoder in each frame. Thus, in a variant of the invention, these LPC parameters will be able to be reused, which simplifies the implementation of the block 302 since it then involves a simple looking up of stored values (possibly quantified).

In parallel, the memory of the resampling filter is updated in E405. Once again, a number of cases are possible:

- in the case of a continuous use with more samples to be generated, as is the case in the AMR-WB standard, the last mem_len samples of the input frame are stored, without the predicted samples: mem_sig(0 . . . mem_len−1)=frame(lg−mem_len . . . lg−1), upon resumption of the resampling, the samples obtained at the output sampling frequency replace the samples obtained by using the predicted input signal.

- In the case of continuous frame-by-frame use, the samples obtained by using the predicted input signal are not replaced, only lg_out samples are calculated at the output sampling frequency. If it is considered that the new frame begins at the sample of index lg+plus_sample_in, the memory of the resampling FIR filtering is made up of the past samples of index (lg+plus_sample_in−mem_len lg+plus_sample_in−1) of which a part of this memory, of index (lg . . . lg+plus_sample_in−1), can be either the true signal or the predicted signal. By using the true signal, the first samples are equal to those obtained with a filtering without prediction (result considered as optimal) but, between the last sample obtained with the prediction during the preceding frame and the first sample obtained with the true signal, it is possible to have a small discontinuity. In case of use of the predicted signal in the memory, there is no discontinuity, but a slight error spreads over another filt_len samples. In the preferred embodiment, the first solution is used because this slight discontinuity is not audible.

- In case of one-off use, the memory update is not necessary after the resampling, but the resampling memories must be initialized before the resampling operation, with the corresponding past input signal.

In a variant, the LPC analysis used to predict the future signal is performed not on the signal directly in the current frame, but on the pre-emphasized signal, obtained from the filtering of the current frame by a filter of the form $1-\mu \cdot z^{-1}$, where $\mu$ is calculated adaptively or set at a predetermined value. This variant is illustrated in FIG. 4b. Compared to FIG. 4a, a step E406 of determination of the pre-emphasis factor $\mu$ is added. By using this factor $\mu$, the input signal is pre-emphasized in this step E407 by $1-\mu \cdot z^{-1}$ filtering. It should be noted that this filtering necessitates a memory sample, therefore, in this variant, the size of the memory is to be increased by 1. The pre-emphasized signal is the input of the steps E401 and E402. The concatenated signal is then de-emphasized by using the same factor $\mu$ in the step E408 by $1/(1-\mu z^{-1})$ filtering. It should be noted that, for a given signal, the sequencing of the pre-emphasis before LPC analysis followed by a de-emphasis by the same factor $\mu$ is transparent, that is to say that precisely the input signal is retrieved. Therefore, if the signal is stored before the pre-emphasis, only the predicted part has to be de-emphasized to reduce the calculation complexity. This de-emphasized predicted part is then concatenated on the stored signal to form the resampling support vector.

There are a number of techniques for determining the pre-emphasis factor $\mu$ for which values are between −1 and 1.

$\mu$ can be constant, for example $\mu=0.68$ $\mu$ can be constant, dependent on the input sampling frequency $\mu$ can be adaptive according to an analysis of the tilt of the spectrum (method known from the prior art).

Figure 5B:
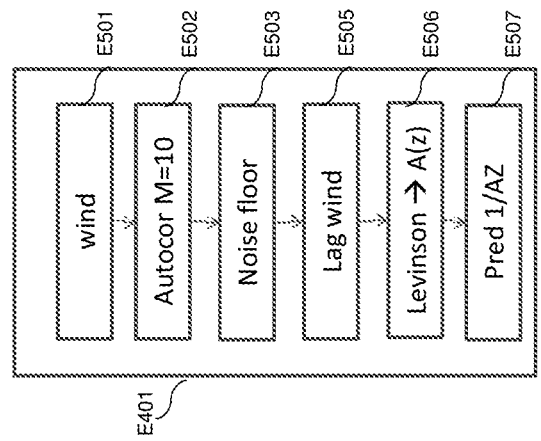
FIG. 5b illustrates, in flow diagram form, the details of the linear prediction step according to an embodiment of the invention.
Figure 5A:
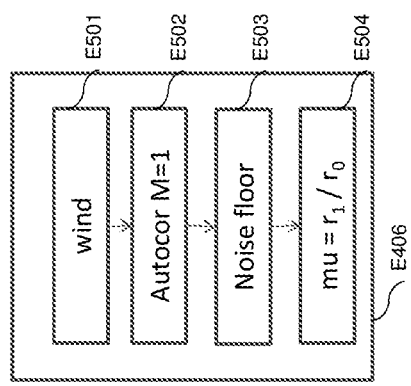
FIG. 5a illustrates, in flow diagram form, the details of the step of determination of the pre-emphasis factor according to an embodiment of the invention.

FIG. 5a illustrates this step E406 of FIG. 4b, of determination of the pre-emphasis factor. In the step E501, the signal is windowed by an analysis window. In the step E502, a self-correlation of order M=1 (r(0) and r(1)) is calculated and a noise threshold (or noise floor) is applied to r(0) in the step E503, to avoid the arithmetical problems of the low level input signals.

These steps of self-correlation, of application of a noise threshold, are for example described in ITU-T recommendation G.729 subsection 3.2.1.

The calculations of self-correlations r(k) with a window of length L for the shifts k=0, . . . , M are of the form:

$$r(k) = \sum_{n=k}^{L-1} s_w(n)s_w(n-k), k = 0, \ldots, M$$

in which $s_w(n)=s(n)\cdot w(n)$ and s(n) corresponds to the last L samples of the signal of the current frame and possibly of past signal if the length L is greater than the length of the current frame.

Figure 6:
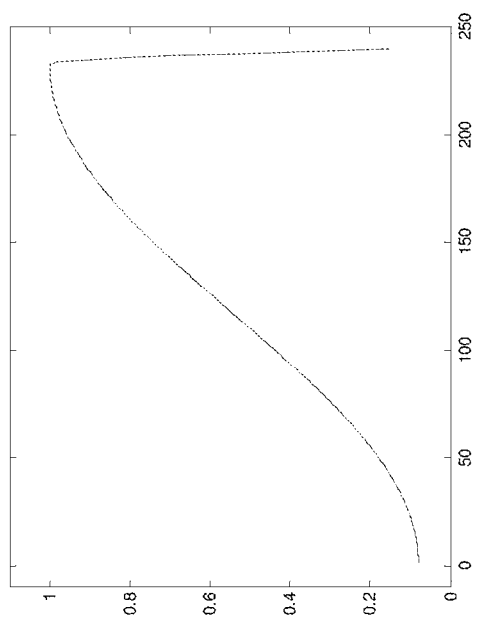
FIG. 6 illustrates the form of an analysis window used in an embodiment of the invention.

In the preferred embodiment an LPC window w(n) length L=240 is used, an example of which is illustrated in FIG. 6.

It can be seen that the form of this window is asymmetrical with the weight concentrated on the end of its support (on the most recent samples). The matlab commands to construct this window with L=240 are for example given below:

```
L1 = L−8;
for i = 0: (L1−1)
    w(i+1) = 0.54 − 0.46 * cos(2 * i * pi / (2 * L1 − 1));
end
for i = L1 : (L−1)
    w(i+1) = cos((i − L1) * 2 * pi / (31));
end
```

In variants of the invention, other values of the LPC order M, other forms and lengths of LPC window will be able to be used without changing the nature of the invention. The "noise floor" will be able to be used in a conventional manner by multiplying the first correlation coefficient by a factor >1 or by limiting the value of this first coefficient to a minimum value.

Finally, the factor is calculated in the step E504 as $\mu=r(1)/r(0)$.

FIG. 5b describes, in more detail, an embodiment of the step E401 of the FIG. 4, of linear prediction to determine the future samples according to the invention.

For example, this step E401 can comprise a step E506 of calculation of coefficients of a linear prediction filter of predetermined order, from the samples of the current frame and possibly samples of the preceding frames and a step E507 of obtaining future signal samples by application of the calculated prediction filter to an excitation signal of null value.

The steps E501, E502 and E503 of FIGS. 5a and 5b are similar, but with a different prediction order M. The other parameters such as the form or the length of the analysis window or even the "noise floor" can also be different. In both cases, the modules in common can be used to reduce the complexity.

More specifically, the input signal (pre-emphasized or not) is windowed in the step E501. It is for example possible to use the same type of window as that illustrated in FIG. 6. The self-correlation function is calculated at the chosen order (in the example, M=10) in E502 and a noise floor is applied to r(0) in the step E503, as described for example in subsection 3.2 of the G.729 standard.

In the step E505, a step called "Lag windowing" (a method known to those skilled in the art) is performed, also described notably in the subsection 3.2.1 of the G.729 standard.

This step of "Lag windowing" for the input sampling frequency ($f_1$) is of the form:

$$r(i)=r(i)*w_{lag}(i), i=0, \ldots, M$$

in which the coefficients $w_{lag}(i)$ are defined as follows:

$$w_{lag}(i) = \exp\left[-\frac{1}{2}\left(\frac{2\pi f_0 i}{f_s}\right)^2\right], i = 1, \ldots, 16$$

in which $f_s=f_{in}$ is the frequency of the signal to be resampled and in which, for example, $f_0=60$ Hz.

In the step E506 (implemented by the module 302 of FIG. 3), the coefficients A[i], i=0, ..., M, of a linear prediction filter A(z) of order M, are calculated by the Levinson-Durbin algorithm as described with reference to subsection 3.2.2 of G.729 or subsection 6.4.3 of the AMR-WB standard. In the preferred embodiment, an LPC order M=10 is used.

In the step E507 (implemented by the module 303 of FIG. 3), the synthesis filter 1/A(z) is applied to a null signal to give a prediction of the future signal samples. This prediction is performed recursively, by 1/A(z) filtering with null input (filter excitation signal), for plus_sample_in samples at the end of the frame of length lg (i=lg lg+plus_sample_in −1):

$$sig(i) = \sum_{j=1}^{M} -sig(i-j)*a(j)$$

In a variant of the invention, other methods for calculating linear prediction coefficients will be able to be used, for example it will be possible to use the Burg method implemented, for example, in the SILK coder known from the prior art.

In another variant, the linear prediction coefficients will be able to be estimated by an approach of LMS (Least Mean Squares) or RLS (Recursive Least Squares) type of adaptive filtering.

In another alternative, the LPC coefficients will be able to be directly obtained from an analysis and/or quantification of the associated parameters, performed on the signal in the coder of TD type (309) using an LPC prediction (302b) even in the FD coder, provided that a linear prediction is performed in the FD coder.

For example, in the CELP decoder of the AMR-WB codec there are LPC coefficients (of order 16) in each subframe and it is in particular possible to use LPC coefficients decoded in the last subframe to predict the future decoded signal and thus eliminate the delay of the resampling of the CELP decoder.

In another variant, the null excitation (null input) in the step E507 can be replaced by an excitation predicted, for example, by pitch prediction in the excitation domain.

In other variants of the invention, the (short-term) linear prediction will be replaced by (long-term) pitch prediction in the domain of the signal, this prediction may be fractional or multi-tap.

It will be noted that it would be possible to perform the prediction in the frequency domain instead of a temporal approach; however, this alternative approach in the frequency domain requires an analysis transformation (for example FFT), a prediction of the future spectrum, for example by repetition of the amplitudes and continuity of the phases of the most important spectral rays and an inverse synthesis transformation or a sinusoidal synthesis; this alternative is generally more complex than the temporal approach described previously, all the more so as the frequency analysis has to have a temporal support that is long enough to have a frequency resolution sufficient to identify spectral rays (tones). This approach is not ideal when the aim is to extrapolate a limited number of samples (less than the frame length).

In yet another embodiment, the adaptive linear prediction described previously can be replaced by an erased frame concealment process in order to extrapolate the future signal by a more sophisticated signal model. Such a technique is for example described in the European patent published under the number: EP1 316 087.

In other variants of the invention, the resampling by FIR filter will be able to be replaced by other resampling methods by IIR filtering or polynomial interpolation. In this case, the principle remains the same: the future signal is predicted and the resampling is applied by taking into account the future signal. In one embodiment, the case of 2 resampling configurations with different delays is considered and the invention makes it possible to bring the longest delay to the lowest delay value.

To be able to demonstrate the effectiveness of low-delay resampling according to the method of the invention described previously in the example of resampling from 8000 Hz to 12 800 Hz, a test signal is used consisting of a mix of 10 sinusoids, the frequency of which changes each second. For the signal of the $i^{th}$ second, the frequencies of these sinusoids have been chosen randomly, around a center frequency $fe_{center}(i)$, in the interval $[fe_{center}(i)-600, fe_{center}(i)+600]$ and $fe_{center}(i)=500+100*i$ Hz, i=1 . . . 28.

FIGS. 7a to 7l represent the results of a comparison between the resampling method of the prior art in AMR-WB (dotted line), that of the method according to the invention with a prediction filter of order M=4 with analysis window of 20 samples (chain-dotted line) and that of the method according to the invention with a linear prediction filter of order 10 with analysis window of 240 samples (continuous line).

The figures represent the signal-to-noise ratio as a function of the center frequency of the test signal.

Figure 1:
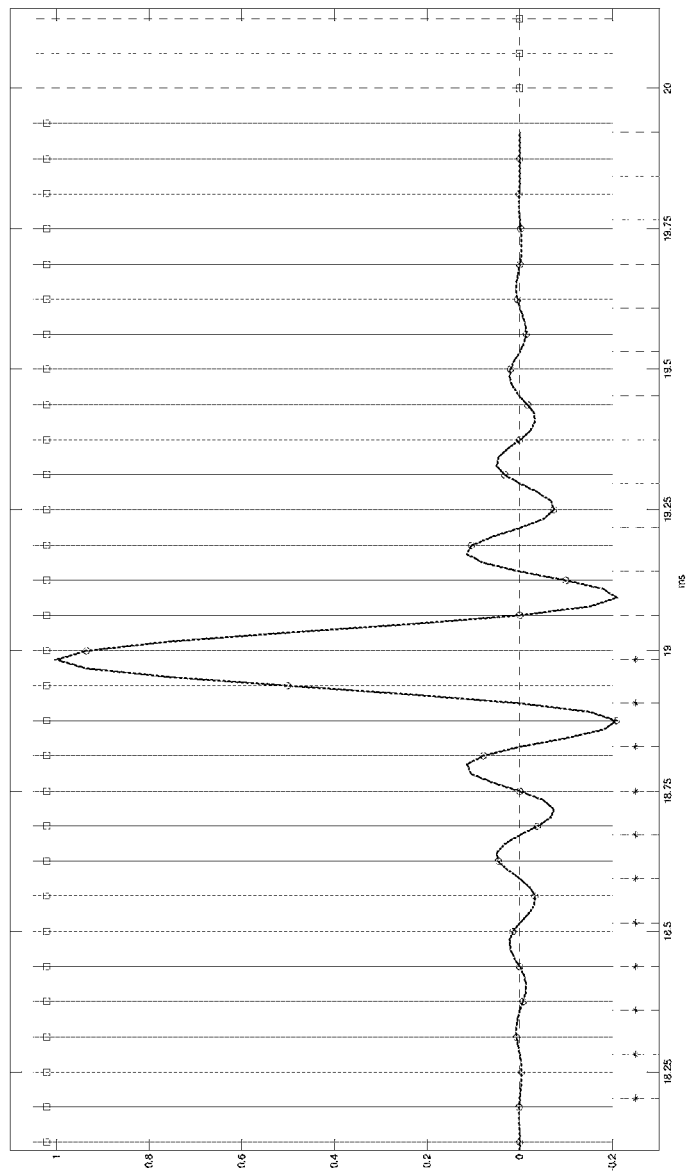
FIG. 1 illustrates the impulse response of a resampling filter in a prior art method as described previously.
Figure 2:
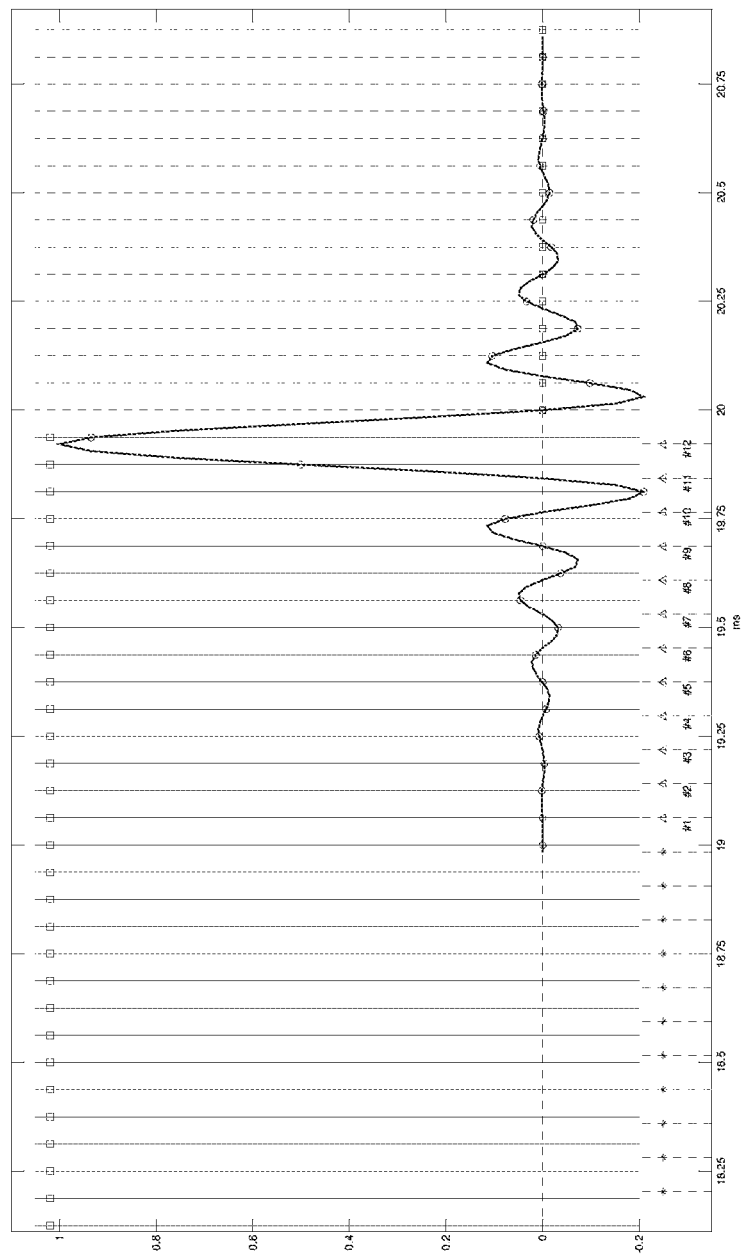
FIG. 2 illustrates the impulse response of a resampling filter in a prior art method with compensation of the delay by zeros as described previously.

Each figure corresponds to a different position of the sample relative to the end of the conventional frame obtained with a conventional filtering (which corresponds to the numbering #1, . . . , #12 of FIG. 2). For example, FIG. 7a represents the signal-to-noise ratio (SNR) for the samples in second position after the end of the conventional frame. FIG. 7b represents the signal-to-noise ratio for the predicted sample in $3^{rd}$ position after the current frame, etc. FIG. 7l therefore represents the signal-to-noise ratio for the predicted sample in $13^{th}$ position after the current frame.

It can be observed that the SNR decreases with the increase in the position because predicted samples are increasingly used during the filtering and that for the same position, the SNR decreases with the increase in the center frequency because the high frequencies are less predictable. However, in all cases, it is observed that the method according to the invention, even with low prediction order, is significantly more efficient than the method used in the AMR-WB coder.

The advantage of the use of a low order prediction is its low complexity and the ease of implementation of the calculations, above all in fixed-point notation arithmetic. The higher the order, the more the complexity increases and, at the same time, the more difficult it becomes to ensure the stability of the filter.

Figure 8B:
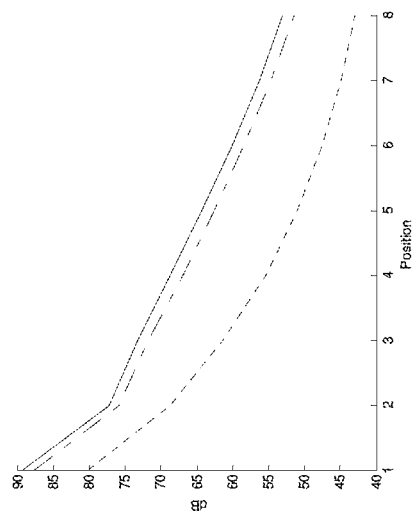
FIGS. 8a to 8c show, for different sample positions following the current signal frame to be resampled, a comparison of the signal-to-noise ratio for three different cases of change of resampling frequencies according to the resampling method of the prior art implemented in the AMR-WB coder and of the resampling method according to a first and a second embodiment of the invention.
Figure 8A:
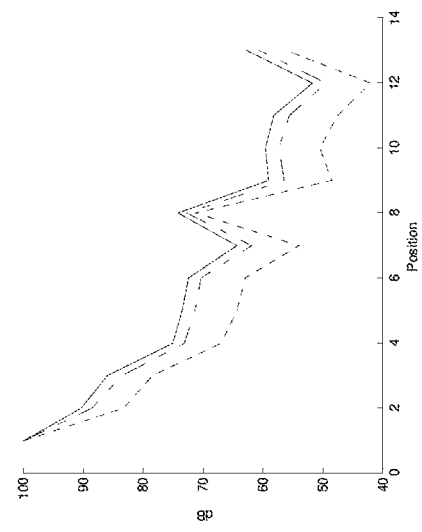
Figure 8C:
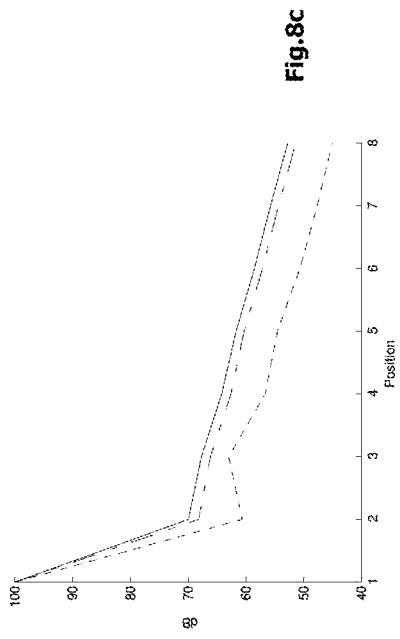

FIGS. 8a to 8c show the same type of result over a very wide speech signal base. Therein the SNR is seen as a function of the position of the sample for 3 different cases: from 8000 Hz to 12 800 Hz in FIG. 8a, from 12 800 Hz to 8000 Hz in FIG. 8b and from 16 000 Hz to 8000 Hz in FIG. 8c. Once again, the algorithm according to the invention is significantly more efficient than that used in the prior art (AMR-WB), even with low prediction order with short window.

Figure 9:
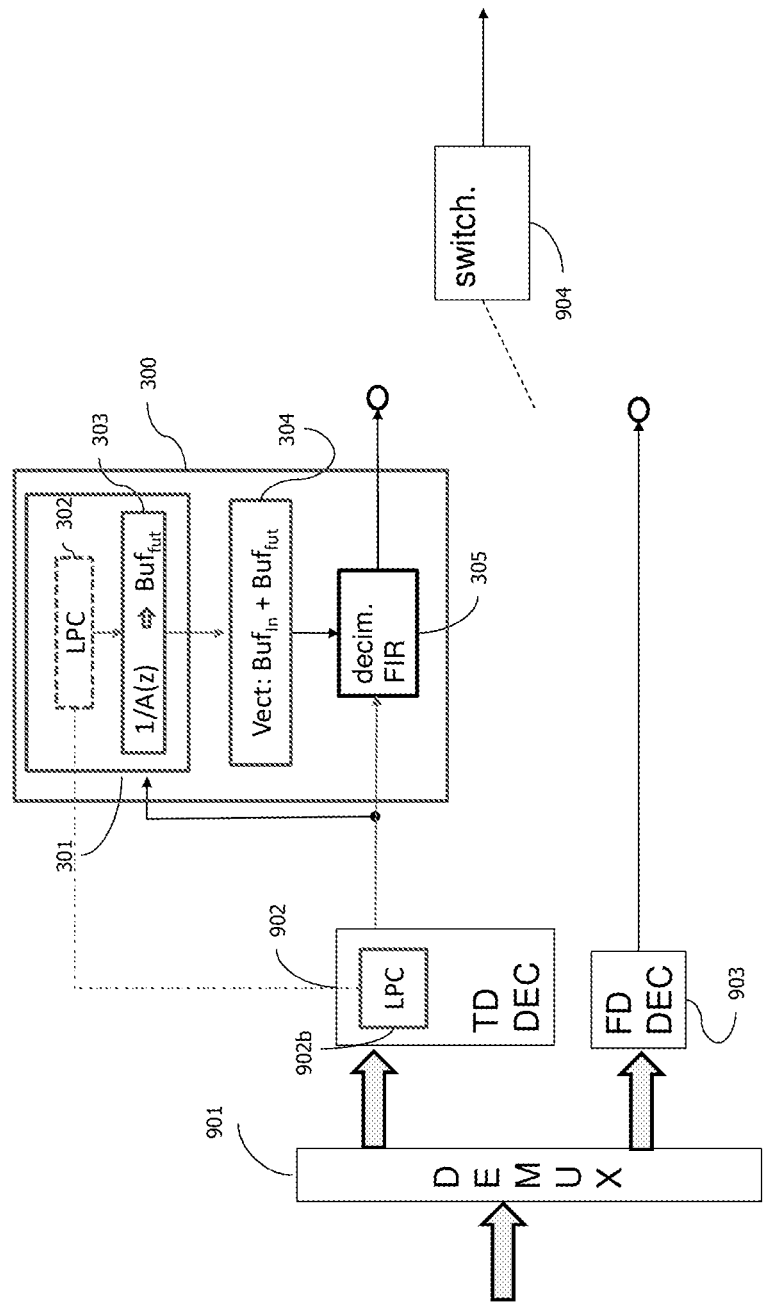
FIG. 9 illustrates an example of an audio signal decoder comprising a resampling device according to an embodiment of the invention.

FIG. 9 illustrates an example of an audio decoder comprising a resampling device 300 according to the invention. The resampling device is the same as that described with reference to FIG. 3.

The decoder illustrated here is a decoder of (mono) audio signals, multiple bit rates (with bit rates set from 7.2 to 128 kbit/s) operating at the output sampling frequencies of 8, 16, 32 or 48 kHz.

Based on the frame received and demultiplexed (block 901), the output is switched (904) between the output of a time division decoder (TD DEC) of CELP type (902) using a linear prediction (902b) and a frequency domain decoder (FD DEC).

Figure 10:
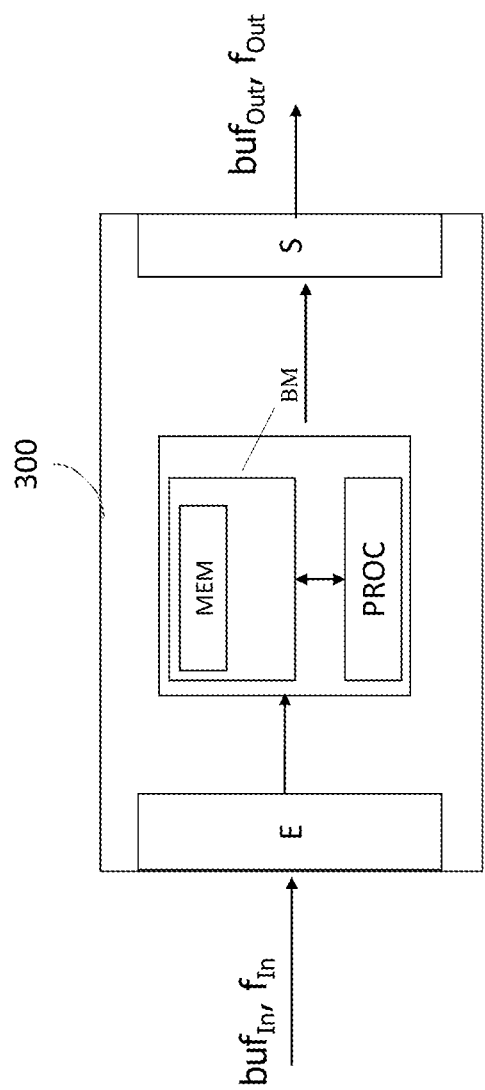
FIG. 10 illustrates a physical representation of a resampling device according to an embodiment of the invention.

FIG. 10 represents an example of hardware embodiment of a resampling device 300 according to the invention. The latter can be made an integral part of an audio frequency signal coder, decoder or of an equipment item receiving audio frequency signals.

This type of device comprises a processor PROC cooperating with a memory block BM comprising a storage and/or working memory MEM.

Such a device comprises an input module E suitable for receiving audio signal frames $Buf_{In}$ at a sampling frequency $f_{In}$.

It comprises an output module S suitable for transmitting the resampled audio frequency signal $Buf_{out}$ at the sampling frequency of $f_{Out}$.

The memory block can advantageously comprise a computer program comprising code instructions for implementing the steps of the resampling method within the meaning of the invention, when these instructions are executed by the processor PROC, and in particular the steps of determination by adaptive linear prediction of a number of future signal samples, this number being defined as a function of a chosen resampling delay, of construction of a resampling support vector from at least samples of the current block and determined future signal samples, of application of a resampling filter to the samples of the resampling support vector.

Typically, the description of FIG. 4a repeats the steps of an algorithm of such a computer program. The computer program can also be stored on a memory medium that can be read by a reader of the device or that can be downloaded into the memory space thereof.

The memory MEM stores, generally, all the data necessary to implement the method.

Although the present disclosure has been described with reference to one or more examples, workers skilled in the art will recognize that changes may be made in form and detail without departing from the scope of the disclosure and/or the appended claims.

The invention claimed is:

1. A method comprising acts of:
   resampling an audio frequency signal by an audio frequency signal coding or decoding device, wherein resampling comprises the following acts for each signal block to be resampled:
   determining, by adaptive linear prediction, a number of future signal samples, the number being defined as a function of a chosen resampling delay;
   constructing a resampling support vector from at least samples of a current signal block and determined future signal samples;
   applying a resampling filter to the samples of the resampling support vector to form a resampled audio frequency signal; and
   outputting the resampled audio frequency signal for at least one of transmission and storage in a memory.

2. The method as claimed in claim 1, wherein the determining act comprises acts of:
   obtaining coefficients of a linear prediction filter of predetermined order;
   obtaining future signal samples by application of the linear prediction filter to an excitation signal of null value.

3. The method as claimed in claim 2, wherein the act of obtaining the coefficients of the linear prediction filter includes an act of reading parameters stored by the coding or decoding device during a coding or decoding of the audio frequency signal.

4. The method as claimed in claim 2, wherein the act of obtaining the coefficients of the linear prediction filter includes an act analyzing at least samples of the current signal block.

5. The method as claimed in claim 1, further comprising an act of pre-emphasis processing the audio frequency signal to obtain a processed audio frequency signal, wherein the adaptive linear prediction is performed on the processed signal audio frequency signal.

6. The method as claimed in claim 1, wherein the adaptive linear prediction is a prediction method selected from one of the following methods:
   short-term linear prediction;
   long-term linear prediction;
   combination of short-term linear prediction and long-term linear prediction;
   erased frame concealment process.

7. A device for resampling an audio frequency signal in an audio frequency signal coder or decoder, wherein the device comprises:
   an adaptive linear prediction module determining, for a signal block, a number of future signal samples defined as a function of a chosen resampling delay;
   a module constructing a resampling support vector from at least samples of the current signal block and determined future signal samples;
   a resampling filter applied to the samples of the resampling support vector to form a resampled audio frequency signal; and
   a memory configured to store the resampled audio frequency signal.

8. The device as claimed in claim 7, wherein the adaptive linear prediction module cooperates with a prediction analysis module included in a prediction coding or decoding module of the coder or decoder.

9. The device as claimed in claim 7, further comprising a further resampling filter to include two resampling filters including the resampling filter and the further resampling filter, the two resampling filters having different delays, at least one of the two resampling filters being implemented such that the number of future signal samples is determined as a function of a delay difference of the two resampling filters.

10. The device as claimed in claim 7, wherein at least one of the coder and the decoder comprises a further resampling filter, the resampling filter and the further resampling filter having different delays, at least one of the resampling and the further resampling filters being implemented such that the number of future signal samples is determined as a function of a delay difference of the resampling and the further resampling filters.

11. A non-transitory processor-readable storage medium, on which is stored a computer program comprising code instructions for executing a resampling method, when the instructions are executed by a processor of an audio frequency signal coding or decoding device, wherein the code instructions configure the processor to perform acts of:
- resampling an audio frequency signal, comprising the following acts for each signal block to be resampled:
- determining, by adaptive linear prediction, a number of future signal samples, the number being defined as a function of a chosen resampling delay;
- constructing a resampling support vector from at least samples of the current signal block and determined future signal samples; and
- applying a resampling filter to the samples of the resampling support vector to form a resampled audio frequency signal; and
- outputting the resampled audio frequency signal for at least one of transmission and storage in a memory.

* * * * *